US010770407B2

(12) United States Patent
Wu et al.

(10) Patent No.: US 10,770,407 B2
(45) Date of Patent: Sep. 8, 2020

(54) IC STRUCTURE WITH INTERDIGITATED CONDUCTIVE ELEMENTS BETWEEN METAL GUARD STRUCTURES

(71) Applicant: GLOBALFOUNDRIES INC., Grand Cayman (KY)

(72) Inventors: Zhuojie Wu, Port Chester, NY (US); Cathryn J. Christiansen, Richmond, VT (US); Erdem Kaltalioglu, Newburgh, NY (US); Ping-Chuan Wang, Hopewell Junction, NY (US); Ronald G. Filippi, Jr., Wappingers Falls, NY (US); Eric D. Hunt-Schroeder, Essex Junction, VT (US); Nicholas A. Polomoff, Irvine, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/240,436

(22) Filed: Jan. 4, 2019

(65) Prior Publication Data

US 2020/0219826 A1 Jul. 9, 2020

(51) Int. Cl.
*H01L 23/00* (2006.01)
*H01L 23/538* (2006.01)
*G01N 27/12* (2006.01)

(52) U.S. Cl.
CPC ......... *H01L 23/562* (2013.01); *G01N 27/121* (2013.01); *H01L 23/5386* (2013.01); *H01L 23/564* (2013.01)

(58) Field of Classification Search
CPC .. H01F 10/324; H01F 10/3281; H01F 41/303; H01F 41/32; H03M 2201/818
See application file for complete search history.

(56) References Cited

U.S. PATENT DOCUMENTS 6,834,547 B2 12/2004 Chen et al.
7,098,676 B2 8/2006 Landers et al.
(Continued)

OTHER PUBLICATIONS

J. R. Lloyd et al., "Effect of moisture on the Time Dependent Dielectric Breakdown (TDDB) behavior in an ultra-low-k (ULK) dielectric," IEEE IIRW Final Report, 2005, pp. 39-43.

*Primary Examiner* — Zandra V Smith
*Assistant Examiner* — Andre C Stevenson
(74) *Attorney, Agent, or Firm* — David Cain; Hoffman Warnick LLC

(57) ABSTRACT

An integrated circuit (IC) structure includes a back end of line (BEOL) stack on a substrate, the BEOL stack having a plurality of metal layers therein and a plurality of inter-level dielectric (ILD) layers therein. The plurality of metal layers includes a lowermost metal layer and an uppermost metal layer. A pair of metal guard structures proximate a perimeter of the BEOL stack concentrically surrounds the active circuitry. Each metal guard structure includes a continuous metal fill between the lowermost metal layer and the uppermost metal layer of the plurality of metal layers. A set of interdigitating conductive elements within one of the plurality of metal layers includes a first plurality of conductive elements electrically coupled to one of the pair of metal guard structures interdigitating with a second plurality of conductive elements electrically coupled to the other of the pair of metal guard structures.

19 Claims, 6 Drawing Sheets

(56) References Cited

U.S. PATENT DOCUMENTS

| | | | | |
|---|---|---|---|---|
| 9,947,602 | B2 | 4/2018 | Wu et al. | |
| 2016/0327502 | A1 | 11/2016 | Chen et al. | |
| 2019/0019693 | A1* | 1/2019 | Or-Bach | H01L 27/0207 |
| 2019/0213375 | A1* | 7/2019 | Suwald | G06F 21/32 |
| 2019/0305077 | A1* | 10/2019 | Feng | H01L 23/5226 |

* cited by examiner

IC STRUCTURE WITH INTERDIGITATED CONDUCTIVE ELEMENTS BETWEEN METAL GUARD STRUCTURES

BACKGROUND

The present disclosure relates to circuit structures, and more specifically, to an integrated circuit (IC) structure for moisture and chip integrity monitoring having interdigitated conductive elements.

During IC packaging and package qualification, monitoring of chip package integrity is an important part of the process. Similar monitoring of crack propagation or moisture ingress may be valuable after a device is manufactured and deployed. IC chips are formed on a semiconductor wafer and separated into individual chips by cutting that can damage the chips. Any moisture or cracks/defects in an IC structure can lead to chip failures and/or performance degradation. Sensing and monitoring moisture and cracks/defects will prevent chip failures from these issues. Various IC chips include one or more metal fills positioned near the perimeter edge for stemming crack propagation or moisture ingress form the edge of the chip. As IC devices continue to shrink and densify, space on an IC chip has become more valuable. It has become more difficult to accommodate each of the various structures for monitoring and preserving the structural integrity of a circuit. In particular, the physical space for accommodating metal fills to obstruct cracks and moisture must compete with the metal wires and circuitry for monitoring the progress of cracks and/or moisture into the structure of an IC chip.

SUMMARY

A first aspect of the disclosure is directed to an integrated circuit (IC) structure, including: a back end of line (BEOL) stack on a substrate, the BEOL stack having a plurality of metal layers therein and a plurality of inter-level dielectric (ILD) layers therein, wherein the plurality of metal layers includes a lowermost metal layer and an uppermost metal layer; active circuitry coupled to at least one of the plurality of metal layers of the BEOL stack; a pair of metal guard structures positioned between the active circuitry and an outer perimeter of the BEOL stack, the pair of metal guard structures concentrically surrounding the active circuitry, wherein each metal guard structure includes a continuous metal fill between the lowermost metal layer and the uppermost metal layer of the plurality of metal layers; and a set of interdigitating conductive elements within one of the plurality of metal layers, the set of interdigitating conductive elements including a first plurality of conductive elements electrically coupled to one of the pair of metal guard structures interdigitating with a second plurality of conductive elements electrically coupled to the other of the pair of metal guard structures.

A second aspect of the disclosure includes an integrated circuit (IC) structure, including: a back end of line (BEOL) stack on a substrate, the BEOL stack having a plurality of metal layers therein and a plurality of inter-level dielectric (ILD) layers therein, wherein the plurality of metal layers includes a lowermost metal layer an uppermost metal layer, and at least one sensor layer between the lowermost metal layer and the uppermost metal layer; active circuitry coupled to at least one of the plurality of metal layers of the BEOL stack; a first metal guard structure positioned between the active circuitry and an outer perimeter of the BEOL stack, wherein the first metal guard structure includes a first continuous metal fill between the lowermost metal layer and the uppermost metal layer of the plurality of metal layers; a second metal guard structure between the active circuitry and the first metal guard structure, and separated from the first metal guard structure by a separation distance, the second metal guard structure concentrically surrounding the active circuitry, wherein the second metal guard structure includes a second continuous metal fill between the lowermost metal layer and the uppermost metal layer of the plurality of metal layers; a first plurality of conductive teeth within the at least one sensor layer and extending horizontally from the first metal guard structure toward the second metal guard structure without contacting the second metal guard structure; and a second plurality of conductive teeth within the at least one sensor layer and extending horizontally from the second metal guard structure toward the first metal guard structure without contacting the first metal guard structure, the second plurality of conductive teeth interdigitating with the first plurality of conductive teeth.

A third aspect of the disclosure relates to a method for monitoring an integrated circuit (IC) structure, the method including: applying a voltage to a pair of metal guard structures within a back end of line (BEOL) stack having a plurality of metal layers, wherein each metal guard structure includes a continuous metal fill between a lowermost metal layer and a uppermost metal layer of the plurality of metal layers, and wherein the pair of metal guard structures includes a set of interdigitating conductive elements within one of the plurality of metal layers, the set of interdigitating conductive elements including a first plurality of conductive elements electrically coupled to one of the pair of metal guard structures interdigitating with a second plurality of conductive elements electrically coupled to the other of the pair of metal guard structures; measuring a test current or capacitance through the pair of metal guard structures based on the applied voltage; calculating a differential current or capacitance between the test current or capacitance and a reference value for the pair of metal guard structures; in response to the differential current or capacitance not exceeding a threshold, repeating the transmitting and calculating; and in response to the differential current or capacitance exceeding the threshold, transmitting a signal to active circuitry of the IC structure to indicate current leakage through the pair of metal guard structures.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

An integrated circuit (IC) structure with interdigitating conductive elements, and related methods of use, are disclosed. Embodiments of the IC structure use structural and functional elements of a continuous metal fill to prevent the ingress of cracks or moisture, and monitor chip integrity with the same structure. "IC structure" as used herein may include circuitry in or on a semiconductor substrate and provided as a complete IC, IC chip or a partial (IC) such as a test site. The IC structure may include a back end of line (BEOL) stack on a substrate. The BEOL stack may include several metal layers, each alternating with inter-level dielectric (ILD) layers. One or more of the metal layers may be designated a sensor layer for monitoring crack propagation and/or moisture ingress through the IC structure. A pair of metal guard structures may concentrically surround active circuitry of the IC structure. Each metal guard structure may provide a continuous metal fill between a lowermost and uppermost metal layer of the BEOL stack. A set of interdigitating conductive elements may include a first plurality of conductive elements electrically coupled to one metal guard structure interdigitating with a second plurality of conductive elements electrically coupled to the other metal guard structure. In some cases, each conductive structure may take the form of a conductive spine, which along with respective plurality of conductive elements electrically coupled thereto, forms a conductive comb structure.

Figure 1:
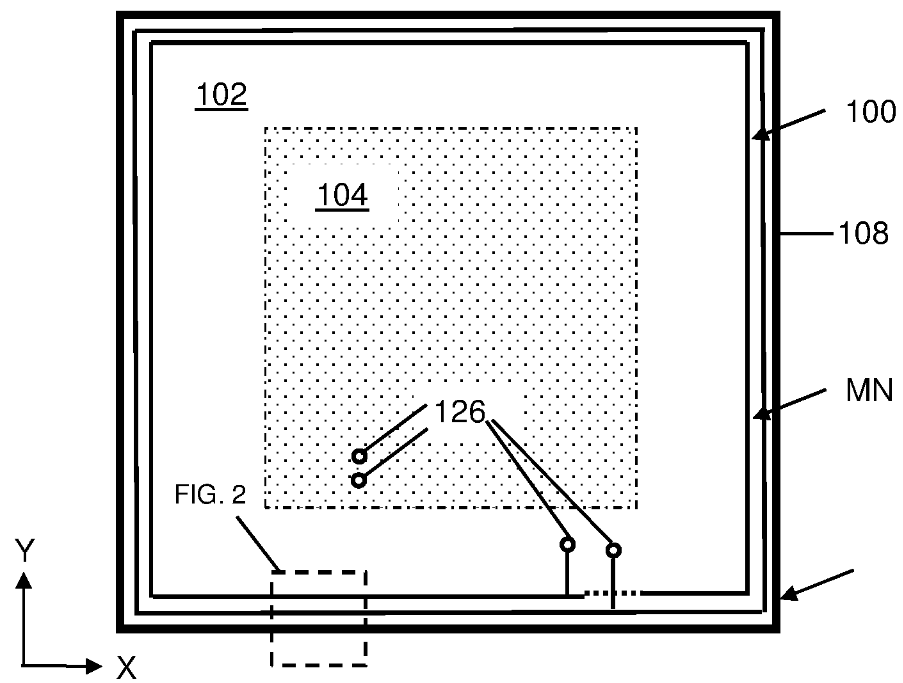
FIG. 1 shows a top view of an IC structure according to embodiments of the disclosure.

Referring to FIG. 1, a top view of an IC structure 100 is illustrated. IC structure 100 includes a back end of line (BEOL) stack 102, which may extend vertically into the page of FIG. 1, and may be positioned over various devices, e.g., transistors, resistors, capacitors, etc. BEOL stack 102 as noted herein may include several metal wires within each layer, in addition to several insulating layers. The various layers of BEOL stack 102 may include active circuitry 104 including, conductive interconnects, metal wires, vias, etc., extending horizontally or vertically therethrough. FIG. 1 shows a top view of IC structure 100, e.g., along an uppermost metal layer MN of BEOL stack 102. Uppermost metal layer MN of BEOL stack 102 may function as a sensor layer, and thus may include conductive features, described herein, near a perimeter 108 of IC structure 100 in BEOL stack 102. Uppermost metal layer MN may be one of several layers of BEOL stack 102, and multiple sensor layers may be vertically interconnected as will be described herein using metal guard structures, vias, and/or other vertically extending conductive materials.

Figure 2:
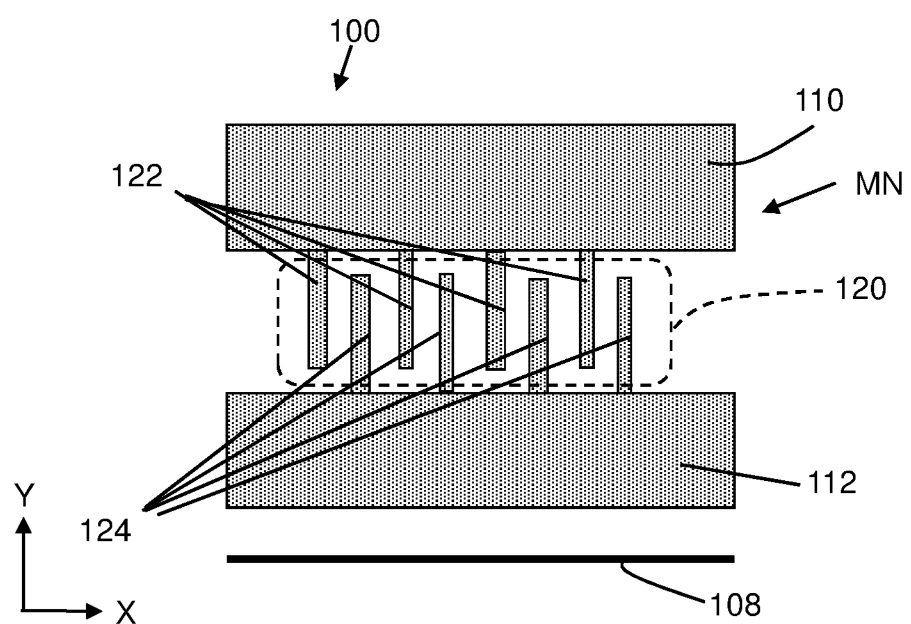
FIG. 2 shows an enlarged top view of a set of interdigitated conductive elements in an IC structure according to embodiments of the disclosure.
Figure 3:
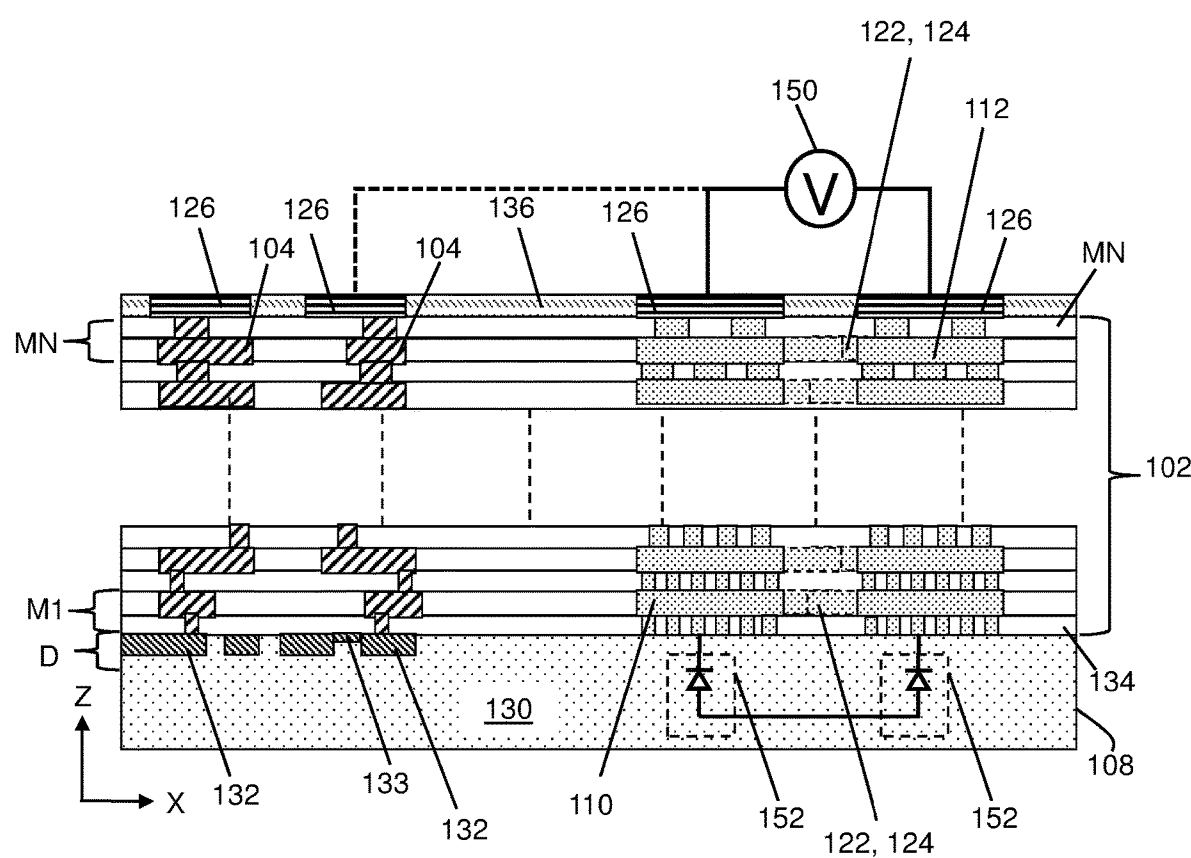
FIG. 3 shows a cross-sectional view of the IC structure according to embodiments of the disclosure.

Referring to FIG. 2, which shows an enlarged view of a section of IC structure 100 from FIG. 1, uppermost metal layer MN may include a first metal guard structure 110 located near perimeter 108 of IC structure 100, and a second metal guard structure 112 disposed parallel to first metal guard structure 110 and perimeter 108 of IC structure 100 (FIG. 1). Each metal guard structure 110, 112 may be a continuous metal fill extending between a lowermost metal level M1 and an uppermost metal level MN of BEOL stack 102, as shown in FIG. 3 and discussed elsewhere herein. Metal guard structures 110, 112 may be provided in the form of one or more metal crack stops (e.g., inner and first metal crack stops, respectively), and/or may include other protective metallic elements such as a moisture oxidation barrier (MOB), guard ring, etc. In any case, IC structure 100 includes a set of interdigitating conductive elements 120 (shown in phantom) electrically coupled to metal guard structures 110, 112. Set of interdigitating conductive elements 120 may include a first plurality of conductive elements 122 electrically coupled to first metal guard structure 110 interdigitating with a second plurality of conductive elements 124 electrically coupled to second metal guard structure 112. As illustrated, first metal guard structure 110 and first plurality of conductive elements 122 are configured in a comb arrangement, and second metal guard structure 112 and second plurality of conductive elements 124 are configured in a comb arrangement. Other arrangements, shapes, sizes, etc., are possible as noted below. First plurality of conductive elements 122 interdigitate with second plurality of conductive elements 124, i.e., they may mesh like the fingers of two clasped hands without) eking.

As shown in FIG. 1, IC structure 100 may also include a terminal 126 coupled to various portions of active circuitry 104, in addition to first and second metal guard structures 110, 112. Each metal guard structure 110, 112 may include a single terminal such that a resistance or capacitance between metal guard structures 110, 112 is electrically measurable as discussed herein. To wire second metal guard structure 112 to terminal 126, a gap (shown in phantom) may be formed in one layer of first metal guard structure 110. The gap within first metal guard structure 110 may be any chosen layer of BEOL stack 102. Such gaps may not appear in first metal guard structure 110 at other layers of IC structure 100. Metal guard structures 110, 112, and set of interdigitating conductive elements 120 may be formed in BEOL stack 102 of IC structure 100 using any now known or later developed semiconductor fabrication process appropriate for the particular dimensions of a particular layer, e.g., electroplating; or dielectric layer photolithographic patterning, etching, conductor deposition and planarization, etc. While terms such as "elements" and "structures" have been used herein to differentiate features of IC structure 100, the features will typically include the same conductive material, e.g., copper, aluminum, etc., and depending on the deployment of IC structure 100 in which the features are used, they may be positioned within any appropriate dielectric material of IC structure 100, e.g., silicon oxide, low-k dielectric, etc.

In the embodiments shown, first plurality of conductive elements 122 extend horizontally perpendicularly from first metal guard structure 110 and second plurality of conductive elements 124 extend perpendicularly from second metal guard structure 112. Although not shown, it will be appreciated that conductive elements 122, 124 may extend in parallel fashion at an angle other than perpendicular from respective metal guard structures 110, 112 while interdigitating with each other. In any event, first metal guard structure 110 and second metal guard structure 112 may be each individually wider than any conductive element 122, 124 in set of interdigitated conductive elements 120. In further embodiments, interdigitating conductive elements 122, 124 may have at least one of: different sized conductive elements, wholly or partially linear or curvilinear conductive elements, different spacing between conductive elements and different density of conductive elements. Through selection of different sizes, spaces, density, etc., sets of interdigitating conductive elements 122, 124 within a particular IC structure, the sensor can be highly customized for a particular application.

Turning to FIG. 3, a cross-sectional view of IC structure 100 in plane X-Z is shown to further illustrate embodiments of the disclosure. IC structure 100 may include a substrate 130, serving as a base material to form one or more devices and a foundation for subsequently-formed metal wiring levels of a structure. Substrate 130 may include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 130 may be situated in or beneath a first level M1 of BEOL stack 102. One or more active components 132 (including, e.g., doped semiconductor material) may define a device layer D, also known as an active region, of IC structure 100. Device layer D may include various active components 132 (e.g., transistors, capacitors, resistors, etc.) defining a portion of, or otherwise connected to, active circuitry 104 of IC structure 100. Device layer D may also include one or more memory elements 133 for storing and/or retrieving various forms of data. In the example of FIG. 3, memory element 133 is shown as an electrically programmable fuse, or "e-fuse." An e-fuse refers to a thin portion of wiring materials configured to break down when a circuit passes therethrough. The e-fuse being programmed or non-programmed may denote a one or a zero in a data catalogue. Memory element 133 may additionally or alternatively include, e.g., one or more memory cells including without limitation static random access memory (SRAM), dynamic random access memory (DRAM), transistor-based memory arrays, and/or other currently known or later developed memory storage or retrieval devices.

First metal layer M1 may include an inter-level dielectric (ILD) 134 formed on substrate 130 and active components 132 to physically and electrically separate device layer D from overlying wiring layers, e.g., lowermost metal layer M1 and uppermost metal layer MN. ILD 134 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Active circuitry 104 of IC structure 100 above first level M1 may include various wiring materials for providing internal connections within BEOL stack 102, and/or to form electrical pathways to external components. Active circuitry 104 thus may include metal wires composed of any currently known or later-developed electrically conductive material including, e.g., copper (Cu), aluminum (Al), silver (Ag), gold (Au), combinations thereof, etc. Active circuitry 104 may also include vertically-extending wires, also known as vias, formed of the same or similar conductive materials and positioned between horizontally-extending metal wires within BEOL stack 102. Each via of active circuitry 104, in an embodiment, can comprise any standard conductive metal (for example, copper) with a lining material (not shown) thereon, such as tantalum nitride (TaN). Active circuitry 104 may be formed and positioned within various regions of ILD 134 and/or other regions of electrically insulative or semiconductive material (e.g., a region of semiconductor material or an electrically insulating dielectric material), such that active circuitry 104 transmits electricity between other electrically conductive structures in contact therewith. Active circuitry 104 positioned within a lowermost metal level M1 can extend in a particular direction (e.g., along axis X). Active circuitry 104 positioned within an uppermost metal level MN can similarly extend along axis X in the same direction as active circuitry 104 in lowermost metal level M1, or a different direction. Lowermost and uppermost metal levels M1, MN are specifically noted in FIG. 3, but BEOL stack 102 may include any conceivable number of metal levels. In a partially or fully manufactured product, for example, BEOL stack 102 may include five metal levels, ten metal levels, twenty metal levels, one-hundred or more metal levels, etc. Lowermost metal level M1 and uppermost metal level MN may be vertically separated from each other (e.g., along axis "Z" shown in FIG. 3), either as directly adjacent metal levels or with intervening metal and insulator levels positioned therebetween.

Lowermost and uppermost metal levels M1, MN may be separated from one another by one or more intervening metal levels. As suggested by the notations M1 and MN, the number of metal levels can vary depending on the chosen implementation and any requirements for back end of line (BEOL) processing. BEOL stack 102 may also include additional regions of ILD 134 between each successive metal level e.g., those vertically between or adjacent to M1, MN. In one embodiment, one or more vias of active circuitry 104 may extend from one metal level to an adjacent metal level, such that metal wire(s) in lowermost metal level M1 may be electrically connected to metal wire(s) in uppermost metal level MN of BEOL stack 102.

First and second metal guard structures 110, 112 may be located on substrate 130, concentric about active circuitry 104 near perimeter 108 of BEOL stack 102. Each metal guard structure 110, 112 may provide a continuous metal fill between lowermost metal layer M1 and uppermost metal layer MN of BEOL stack 102. As shown, metal guard structures 110, 112 may include multiple pillars extending through ILD 134, and a single wire-like region of metal between ILD regions 134, though this is not required in all instances. The shape of metal guard structures 110, 112 may depend on, e.g., simultaneous fabrication of active circuitry 104 and related processes, e.g., single or dual damascene metal deposition, recessing, etching, patterning, etc. One or more layers of BEOL stack 102 may serve as sensor layers as noted herein, and in the example of FIG. 3 each layer of BEOL stack 102 provides a sensor layer for monitoring crack and/or moisture propagation from perimeter 108 toward active circuitry 104. First and second metal guard structures 110, 112 include interdigitating conductive elements 122, 124 within BEOL Stack 102. Interdigitating conductive elements 122, 124 appear to overlap within the cross-sectional view of FIG. 3 solely to emphasize that elements 122, 124 may project from either metal guard structure 110, 112 in plane X-Z. Thus, interdigitating conductive elements 122, 124 are depicted with phantom boxes. It is understood that interdigitating conductive elements 122, 124 do not interlock as noted elsewhere herein.

FIG. 3 shows, as an example, sets of interdigitating conductive elements 122 between metal guard structures 110, 112 at each layer including lowermost metal layer M1 and uppermost metal layer MN. In this case, interdigitating conductive elements 122, 124 may be substantially identical to those in other layers, i.e., have the same arrangement of conductive structures and sets of interdigitating conductive elements. In another embodiment however, two or more sensor layers may have interdigitating conductive elements 122, 124 with different arrangements.

IC structure 100 may include a seal layer 136 positioned on BEOL stack 102. Seal layer 136 may include one or more insulators (e.g., nitride and/or oxide insulators) to electrically separate BEOL stack 102 from overlying chip packaging materials and/or components. Terminals 126 for connecting active circuitry 104 and conductive elements 122, 124 to various interconnect elements (e.g., conductive solder bumps, not shown) or sensing equipment may initially be formed on BEOL stack 102 before seal layer 136 is deposited thereon. A sensor 150 for applying a voltage to measure current leakage across metal guard structures 110, 112 may be coupled to IC structure 100. Sensor 150 may be embodied, e.g., as any currently known or later developed electronic testing device capable of being manufactured and deployed separately from IC structure 100. In other embodiments, sensor 150 itself may include an IC structure and/or may be structurally integrated into IC structure 100. Sensor 150 is depicted for the sake of example as being a device independent from IC structure 100, though it is understood that sensor 150 may operate substantially identically regardless of the chosen embodiment. Sensor 150 may have two terminals with opposite polarity, which may be coupled to metal guard structures 110, 112, respectively. As discussed elsewhere herein, sensor 150 may be used to monitor current flow through, and/or capacitance across metal guard structures 110, 112. Sensor 150 may be configured to detect moisture ingress and/or crack propagation in methods for monitoring IC structure 100. Sensor 150 optionally may be electrically coupled to portions of active circuitry 104, e.g., through one or more wires as shown with phantom lines in FIG. 3. In this case, sensor 150 may include a unit gain amplifier and/or similar component for mirroring a voltage of active circuitry 104, and applying the mirrored voltage to metal guard structures 110, 112 through terminals 126. Sensor 150 may also be configured to store or retrieve data in memory element(s) 133 of active circuitry 104, e.g., during methods according to the disclosure.

In some cases, IC structure 100 optionally may include a pair of electrostatic discharge (ESD) diodes 152 within substrate 130 below BEOL stack 102. Each ESD diode 152 may be formed by any currently known or later developed process to form diode connections between conductive or semiconductive regions. In many cases, ESD diodes 152 may be formed of oppositely-doped semiconductor regions within substrate 130 to form one or more P-N junctions. In any case, ESD diodes 152 may protect metal guard structures 110, 112 from damage during an electrostatic discharge event, e.g., during package assembly and operation.

Figure 4:
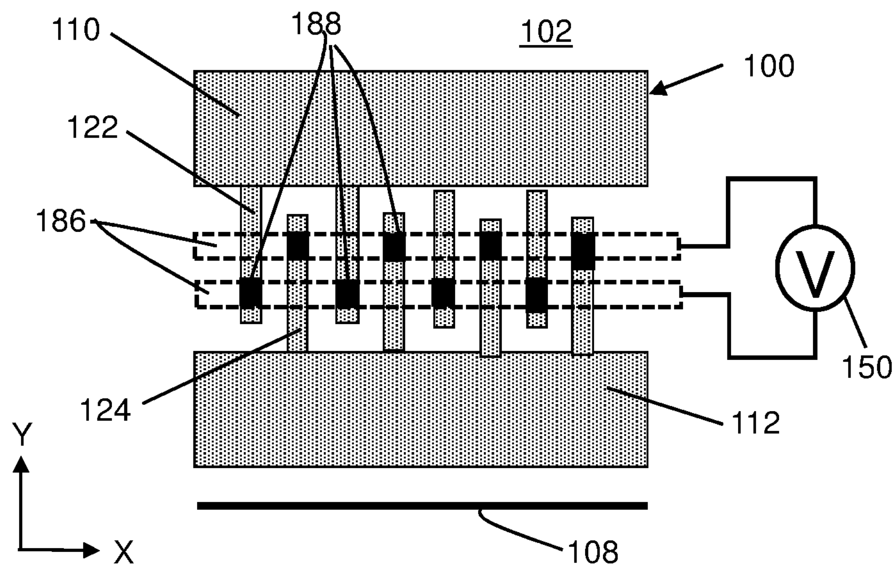
FIG. 4 shows an enlarged top view of the IC structure with a sensing wire and vias according to embodiments of the disclosure.

Turning now to FIG. 4, an enlarged top view IC structure 100 is shown according to further embodiments of the disclosure. As shown, IC structure 100 may include sensing wires 186 distinct from conductive elements 122, 124. Sensing wires 186 may be configured to electrically connect sensor 150 to selected portions of IC structure 100. In the example embodiment of FIG. 4, IC structure 100 may include several vertically-extending vias 188 positioned on respective conductive elements 122, 124. Vias 188 may electrically connect elements 122, 124 to wires, vias, active devices, etc., in other layers of BEOL stack 102 and/or active circuitry 104 for routing test currents through conductive elements 122, 124. In the example shown, conductive elements 122, 124 are positioned in a single layer of BEOL 102 and coupled to two sensing wires 186, in another layer(s) of BEOL stack 102 through vias 188. Sensing wires 186, depicted in phantom, may be positioned in any one or more layers different from conductive elements 122, 124. A group of sensing wires 186 additionally may be electrically coupled directly to opposite terminals sensor 150 through vias 188 on conductive elements 122, 124. The embodiment of FIG. 4 thus may include sensing wires 186 configured to electrically monitor conductive elements 122, 124 by measuring resistance at selected locations. In this case, higher-risk portions of IC structure 100 may be monitored for moisture ingress and/or crack propagation without monitoring lower-risk portions of a device.

Figure 5:
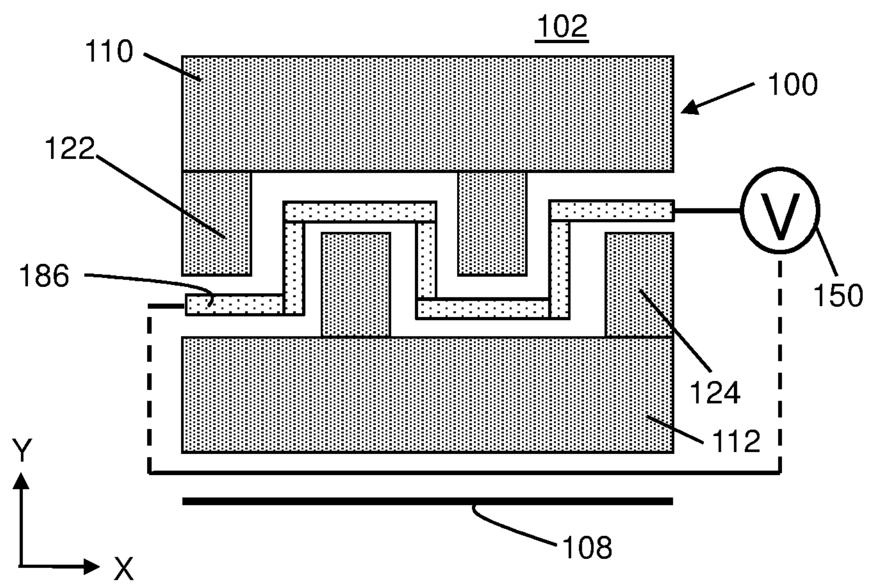
FIG. 5 shows an enlarged top view of the IC structure with a sensing wire discontinuous from the plurality of conductive elements according to embodiments of the disclosure.

Referring to FIG. 5, IC structure 100 is shown with other features for monitoring moisture ingress, crack propagation, etc. In the example of FIG. 5, sensing wire 186 may be located within the same layer of BEOL stack 102 as set metal guard structures 110, 112 and conductive elements 122, 124. In this case, sensing wire 186 may be discontinuous from conductive elements 122, 124 and may traverse a serpentine path between structures 110, 112 and elements 122, 124 within a single layer. In this manner, sensing wire 186 may be effective to monitor current, capacitance, etc., within BEOL stack 102 between metal guard structures 110, 112. As shown, sensor 150 may be electrically coupled to opposite terminals of sensing wire 186. Ingress of moisture and/or crack propagation through IC structure 100 may affect the properties of sensing wire 186, thereby causing an applied voltage to produce varying amounts of current through sensing wire 186. Similar to the example shown in FIG. 5, sensing wire 186 being horizontally between, and discontinuous from, elements 122, 124 may allow a quality analyst to monitor moisture ingress and/or crack propagation at selected portions of IC structure 100. As compared to embodiments that use conductive elements 122, 124 as part of a testing pathway, sensing wire 186 may create a closed circuit for measuring resistance instead of capacitance.

Figure 6:
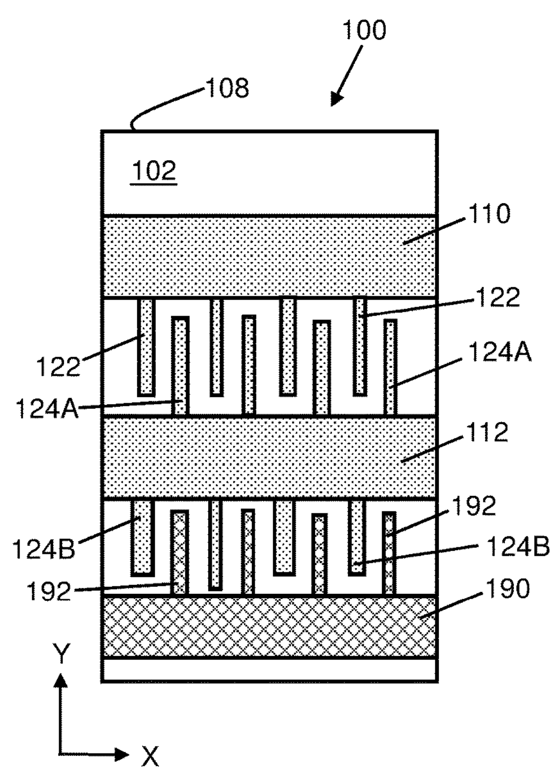
FIG. 6 shows a top view of three metal guard structures and two sets of interdigitated conductive elements according to embodiments of the disclosure.
Figure 7:
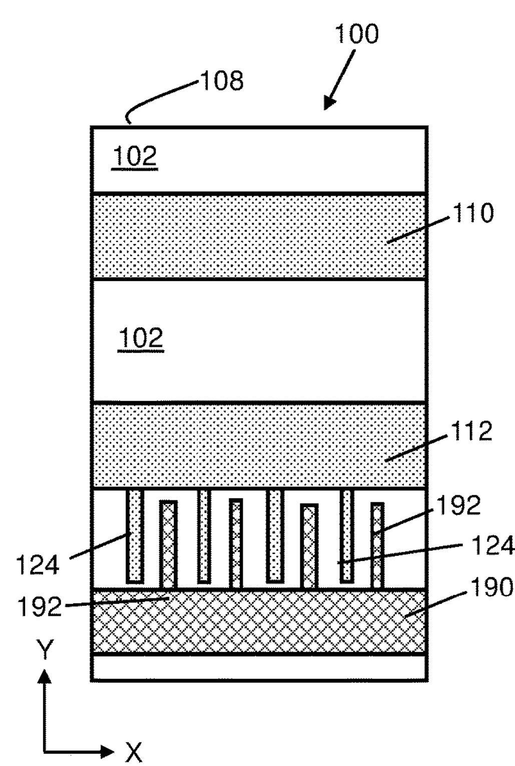
FIG. 7 shows a top view of three metal guard structures and one set of interdigitated conductive elements according to embodiments of the disclosure.

FIGS. 6 and 7 depict further embodiments of IC structure 100, in which more than two metal guard structures may be used. As illustrated, IC structure 100 may include at least one additional guard structure 190 with an additional set of conductive elements 192 extending perpendicularly from additional guard structure 190. Additional guard structure 190 may be a distinct structure and/or function from first and second metal guard structures 110, 112. In a first example, additional guard structure 190 may be a moisture oxidation barrier (MOB). Although crack stop and MOB structures each may be formed of metal, MOB structures are specifically designed to prevent moisture ingress from the exterior of a chip from traveling toward active components of a device. An MOB structure thus may have more or fewer vias connecting metal regions in respective metal layers, as compared to the number of via-type connecting metals in a metal crack stop. In still further examples, additional guard structure 190 may include a guard ring specifically designed to protect photonic integrated circuit (PIC) dies. A guard ring may refer to a continuous wall of metal concentrically surrounding the active electrical and optical components on a PIC die. In further examples, additional guard structure 190 may be an additional metal crack stop, either distinct or substantially identical to first and second metal guard structures 110, 112.

Regardless of the structure and function of additional metal guard structure 190, embodiments of the disclosure may include each structure 110, 112, 190 near perimeter 108 of IC structure 100. In this arrangement, each structure 110, 112, 190 may have one or more pluralities of conductive elements 122, 124, 192 interdigitating with the conductive elements of an adjacent structure. Portions of each guard structure 110, 112, 190 may extend in parallel with each other to permit interdigitating of conductive elements 122, 124, 192 as discussed herein. In the example of FIG. 6, second metal guard structure 112 has two pluralities of conductive elements 124A, 124B extending perpendicularly therefrom. However, it is understood that other metal guard structures 110, 190 may additionally or alternatively have multiple pluralities of conductive elements extending therefrom. In the further example of FIG. 7, first metal guard structure 110 may lack any conductive elements, while second metal guard structure 112 and additional metal guard structure 190 may feature interdigitating conductive elements 124, 192 horizontally inward of first metal guard structure 110. It is possible for second metal guard structure 112 to lack conductive elements, and/or for multiple additional guard structures 190 to have sets of interdigitating conductive elements 192 therebetween.

The resulting IC structure (and/or sensor) described herein can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip may be then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 8:
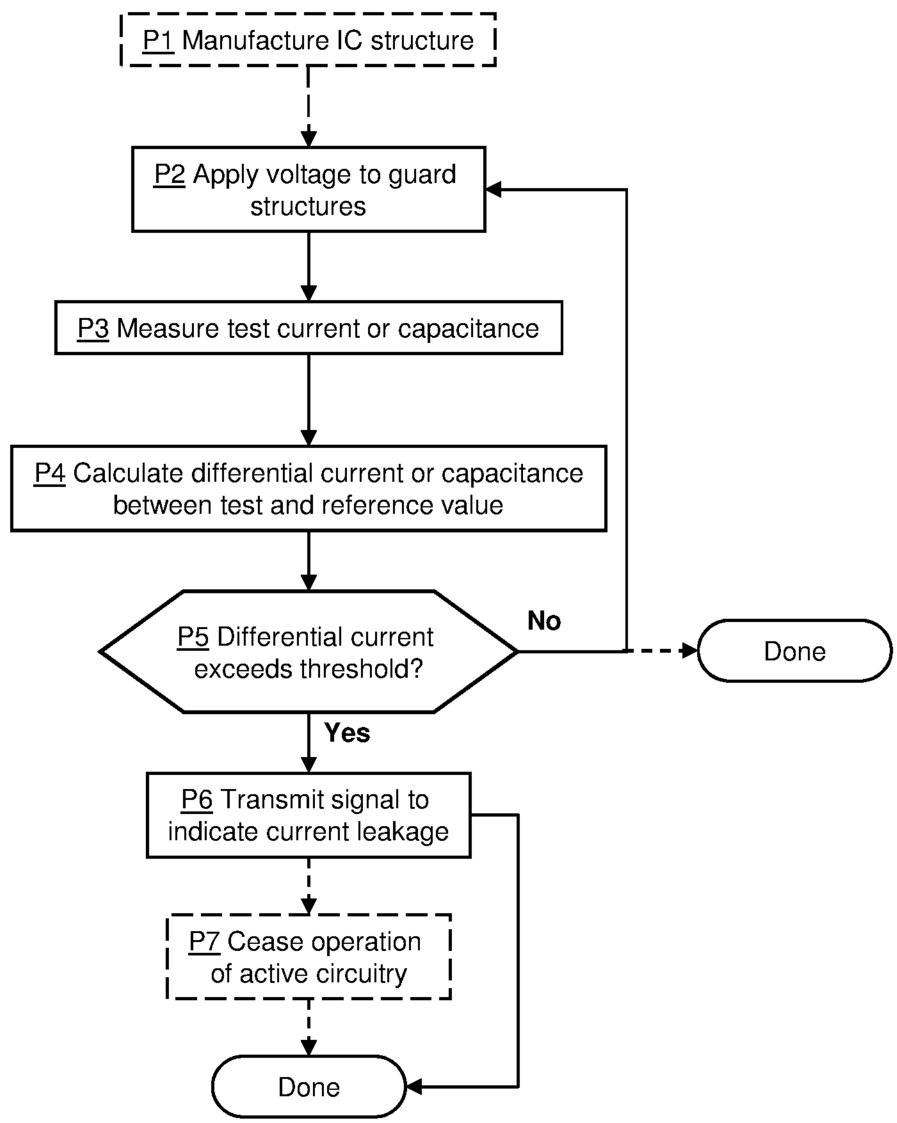
FIG. 8 provides an illustrative flow diagram for implementing methods according to embodiments of the disclosure.

Referring now to FIGS. 1, 3, and 8 together, embodiments of the disclosure provide methods of monitoring moisture ingress, crack propagation, and/or other characteristics of IC structure 100. The various processes described herein may be implemented at the time of manufacture, or various processes may be implemented and/or repeated after the time of manufacture to periodically monitor the condition of IC structure 100. The illustrative flow diagram of FIG. 8 represents one possible ordering of the various processes discussed herein, and it is understood that some processes may be re-ordered, modified, omitted, etc., without departing from the technical details and features discussed herein. Regardless of whether moisture ingress and/or crack propagation through IC structure 100 is being monitored, the same processes and/or metrics may be used in methods according to the disclosure. Points of reference and/or comparison may be adjusted for closer sensitivity to the source of electrical variation, e.g., moisture or crack propagation.

An initial process P1 (shown in phantom) may include forming an embodiment of IC structure 100, including BEOL stack 102 with metal guard structures 110, 112. The providing may include forming IC structure 100 with conductive elements 122, 124 to monitor a portion of BEOL stack 102 near perimeter 108. Process P1 may also include modifying and/or otherwise obtaining IC structure 100 with the various components thereof integrated therein. Process P1 in some cases may also include coupling metal guard structures 110, 112, or other components of IC structure 100 where applicable, to sensor 150 as discussed herein. Regardless of how IC structure 100 is provided, the following processes discussed herein may be implemented on any embodiment of IC structure 100 discussed herein.

Continuing to process P2, embodiments of the disclosure allow a user to monitor moisture ingress and/or crack propagation through IC structure 100. Embodiments of IC structure 100 monitor moisture ingress and/or crack propagation near perimeter 108 of IC structure 100 by testing the flow of electricity through metal guard structures 110, 112. At process P2, a user may apply a voltage across metal guard structures 110, 112 of IC structure 100, e.g., using sensor 150 connected to metal guard structures 110, 112 at opposite terminals. Sensor 150 may be configured to apply a static voltage, e.g., 50 millivolts (mV) across its terminals, and may be configured to measure an electrical current or capacitance induced across metal guard structures 110, 112. As noted elsewhere herein, the voltage applied in process P2 may be configured to mirror an operating voltage of active circuitry 104. In this case, the applying of a voltage in process P2 may include enabling a unity-gain amplifier of sensor 150 to apply an identical voltage across metal guard structures 110, 112.

Process P3 of the present disclosure may include measuring a test current or capacitance across metal guard structure 110, 112 while applying the test voltage to IC structure 100. The presence of interdigitating conductive elements 122, 124 may create a measurable electrical pathway horizontally across BEOL stack 102 across each metal guard structure 110, 112. In various embodiments, the measured electrical pathway between metal guard structures 110, 112 optionally may include and/or rely upon embodiments of sensing wire 186 (FIGS. 4, 5). Sensor 150 thus may include an ammeter, capacitance meter, and/or other component for measuring the electrical current or capacitance induced by a fixed test voltage (e.g., to measure resistance) or an alternating current (AC) voltage in combination with the fixed test voltage (e.g., to measure capacitance). The measured current or capacitance may be identified herein as a test current or capacitance, i.e., the electrical current or capacitance induced by a voltage (e.g., a fixed DC voltage or an applied AC voltage as noted above) during one instance of testing. Although measuring a voltage-induced current may be more responsive for many IC structures 100.

Continuing to process P4, embodiments of the disclosure may include analyzing the current or capacitance to determine whether significant moisture ingress and/or crack propagation exists in IC structure 100. Process P4 may include calculating a differential current or capacitance between the measured test current or capacitance and one or more predetermined reference values. In various embodiments, a specification for IC structure 100 may include a minimum current or capacitance, and/or range of currents/capacitances indicative of mechanical stability between metal guard structures 110, 112. The specification current or capacitance through metal guard structures 110, 112 may be denoted as a reference value, regardless of whether the specification defines a minimum current/capacitances, range of currents/capacitances, etc. The reference value may be obtained via design characteristics of IC structure 100 or similar product units, or may be obtained by performing experiments on IC structure 100 as noted herein relative to further embodiments. In any case, the differential current or capacitance calculated in process P4 may be a subtractive difference between the test current or capacitance measured in process P3, and one or more values representing a reference value for comparison. In the case of a single reference value, the differential current calculated in process P4 may be a difference in amperes (A) between the measured test current and the predetermined reference value. When conducting a test based on capacitance, a difference in capacitance calculated in process P4 may be a difference in picofarads (pF) between the measured test capacitance and the predetermined reference value. In the case of a range of reference values, the differential current or capacitance may be a subtractive difference between the measured test current or capacitance and one or more values within the specified reference value range (e.g., maximum value, minimum value, median value, set percentile value, etc.)

Embodiments of the disclosure may include process P5 of determining whether the differential current or capacitance calculated in process P4 exceeds a threshold for IC structure 100. As used herein, "threshold" may indicate a minimum safe difference between measured currents or capacitances and reference currents or capacitances. Exceeding the threshold may indicate a significant increase of current or capacitance between metal guard structures 110, 112. The basis for determining whether the calculated differential current or capacitance exceeds, or does not exceed, the threshold may depend at least partially on the calculation(s) implemented in processes P3, P4. In an example where the differential current or capacitance is calculated as a single value, process P5 may determine whether the differential current or capacitance indicates that the test current or capacitance exceeds the reference value by a predetermined threshold. The predetermined threshold may represent, e.g., a window of acceptable currents/capacitances indicating that moisture ingress and/or crack propagation is not significant. In another example, the differential current or capacitance may be calculated as a range of values relative to a range of reference values for IC structure 100. In this case, process P5 may include determining whether any or all values in the calculated range exceed the corresponding range of reference values by at least a minimum amount. In cases where the calculated differential current or capacitance does not exceed the threshold (i.e., "No" at process P5), the flow may return to process P2 of applying another voltage to first and second metal guard structures 110, 112, or otherwise may conclude ("Done"). In either case, IC structure 100 may continue to operate without further testing for a predetermined time (e.g., several hours of operating time, several days or hours without regard to operation, etc.) before repeating any or all of processes P2, P3, P4, and/or P5. In the case where the differential current or capacitance exceeds the threshold (i.e., "Yes" at process P5), the flow may proceed to additional steps to account for possible moisture ingress and/or crack propagation.

To account for possible moisture ingress and/or crack propagation through metal guard structures 110, 112 of IC structure 100, process P6 may include transmitting a signal to active circuitry 104 to indicate the measured leakage. The transmitting of a signal to indicate leakage may include, e.g., directly transmitting a signal from sensor 150 to active circuitry 104 through corresponding wires, wirelessly signaling active circuitry 104, etc. Various embodiments of process P6 may include any other currently known or later developed methods for causing IC structure 100 to notify a user that leakage from moisture ingress and/or crack propagation is detected. The flow may then conclude ("Done") after signaling the detected leakage to active circuitry 104. In further embodiments, the method optionally may include process P7 of ceasing further operation of IC structure 100. In this case, active circuitry 104 may be configured to terminate further operation upon detecting leakage through metal guard structures 110, 112. According to one example, a power supply of IC structure 100 may be configured to shut down upon receiving one or more signals transmitted from sensor 150, e.g., in process P6. The method may then conclude ("Done") to allow a user, device, etc., to further examine, repair, and/or otherwise adjust IC structure 100 to account for possible moisture ingress and/or crack propagation.

Figure 9:
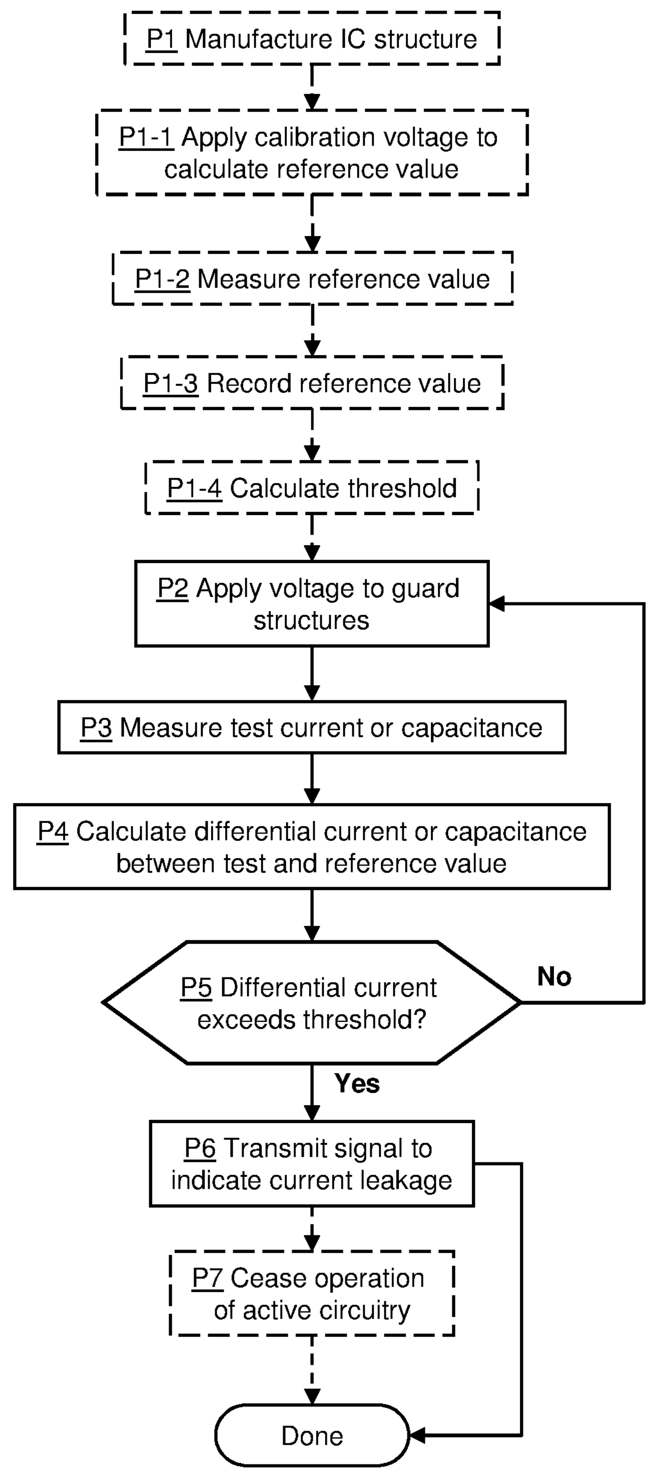
FIG. 9 provides an illustrative flow diagram for implementing methods according to further embodiments of the disclosure.

Referring now to FIGS. 1, 3, and 9 together, further embodiments of the disclosure may optionally include processes P1-1, P1-2, P1-3, P1-4 to prepare IC structure 100 for monitoring of moisture ingress and/or crack propagation. It is understood that processes P1-1, P1-2, P1-3, P1-4 may be implemented only once following process P1, and/or periodically during the field lifespan of IC structure 100. Process P1-1 may include, e.g., applying a calibration voltage to IC structure 100 through sensor 150 immediately after manufacturing of IC structure 100. The calibration voltage in process P1-1 may be the same or different from the voltage applied in process P2 and discussed elsewhere herein. In any case, the applied calibration voltage may measure current flow and/or capacitance through metal guard structures 110, 112 before dicing, or otherwise before any moisture ingress or crack propagation through IC structure 100 after manufacture. The method may then proceed to optional process P1-2 of measuring one or more the ensuing current flows and/or capacitances through metal guard structures 110, 112 as the reference value for IC structure 100. The flow may then proceed to process P1-3 of recording the reference value in memory element 133 of IC structure 100. For example, process P1-3 may include programming an e-fuse of memory element 133, and/or storing the recorded values of current and/or capacitance in memory cells.

Further embodiments of the disclosure may include calculating one or more values for the threshold of process P5. Calculating the threshold in process P1-4 may include, e.g., analyzing a reliability model for current and/or capacitance for IC structure 100 to predict future performance of a device after dicing or deployment. Based on the reliability model and/or other representation of future device operation, process P1-4 may include calculating a set value or range of acceptable electrical currents and/or capacitances through metal guard structures 110, 112 when significant crack propagation and/or moisture ingress does not occur. According to further examples, the calculating of the threshold may be based at least partially on a projected moisture profile of metal guard structures 110, 112. Calculating the threshold may also depend on a projected crack propagation through metal guard structures 110, 112. In either case, the threshold may rely on projected changes to electrical conductance between metal guard structures 110, 112 in a model of moisture ingress and/or crack propagation. The calculated threshold may then be stored, e.g., in memory components of active circuitry 104, elsewhere within IC structure 100, or may by stored for use in process P5 by other currently known or later developed techniques for applying data in an analysis. In any case, the flow may proceed to process P2 after implementing one or more of optional processes P1-1, P1-2, P1-3, P1-4 and/or operating IC structure 100 over a set time span.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:

a back end of line (BEOL) stack on a substrate, the BEOL stack having a plurality of metal layers therein and a plurality of inter-level dielectric (ILD) layers therein, wherein the plurality of metal layers includes a lowermost metal layer and an uppermost metal layer;

active circuitry coupled to at least one of the plurality of metal layers of the BEOL stack;

a pair of metal guard structures positioned between the active circuitry and an outer perimeter of the BEOL stack, the pair of metal guard structures concentrically surrounding the active circuitry, wherein each metal guard structure includes a continuous metal fill between the lowermost metal layer and the uppermost metal layer of the plurality of metal layers, one of the pair of metal guard structures includes a first metal crack stop, and the other of the pair of metal guard structures includes a second metal crack stop, a moisture oxidation barrier (MOB), or a guard ring; and a set of interdigitating conductive elements within one of the plurality of metal layers, the set of interdigitating conductive elements including a first plurality of conductive elements electrically coupled to one of the pair of metal guard structures interdigitating with a second plurality of conductive elements electrically coupled to the other of the pair of metal guard structures.

2. The IC structure of claim 1, wherein the first plurality of conductive elements includes a first conductive element having a first length, the second plurality of conductive elements includes a second conductive element adjacent to the first conductive element and having a second length, wherein a sum of the first length and the second length is greater than the horizontal separation distance between the pair of metal guard structures.

3. The IC structure of claim 1, further comprising one or more electrostatic discharge (ESD) diodes within the substrate below the BEOL stack, the one or more ESD diodes being coupled to the pair of metal guard structures at the lowermost metal layer of the plurality of metal layers.

4. The IC structure of claim 1, further comprising an electronic sensor having a pair of terminals each coupled to one of the pair of metal guard structures at a selected one of the plurality of metal layers, the electronic sensor being configured to measure a leakage current or a capacitance across the set of interdigitating conductive elements.

5. The IC structure of claim 1, further comprising:

a sensing wire within the BEOL stack between the pair of metal guard structures and within a same metal layer as the set of interdigitating conductive elements, wherein the sensing wire is discontinuous from the set of interdigitating conductive elements; and an electronic sensor having a pair of terminals coupled to respective ends of the sensing wire, the electronic sensor being configured to measure a resistance or a capacitance across the set of interdigitating conductive elements through the sensing wire.

6. The IC structure of claim 1, further comprising:

a sensing wire within the BEOL stack between the pair of metal guard structures and within a different metal layer of the BEOL stack from the set of interdigitating conductive elements;

a plurality of vertically-extending vias within the BEOL stack, each of the plurality of vertically-extending vias electrically connecting the sensing wire to the set of interdigitating conductive elements; and an electronic sensor having a pair of terminals coupled to respective ends of the sensing wire, the electronic sensor being configured to measure a current flow or a capacitance across the set of interdigitating conductive elements through the sensing wire.

7. An integrated circuit (IC) structure, comprising:

a back end of line (BEOL) stack on a substrate, the BEOL stack having a plurality of metal layers therein and a plurality of inter-level dielectric (ILD) layers therein, wherein the plurality of metal layers includes a lowermost metal layer an uppermost metal layer, and at least one sensor layer between the lowermost metal layer and the uppermost metal layer;

active circuitry coupled to at least one of the plurality of metal layers of the BEOL stack;

a first metal guard structure positioned between the active circuitry and an outer perimeter of the BEOL stack, wherein the first metal guard structure includes a first continuous metal fill between the lowermost metal layer and the uppermost metal layer of the plurality of metal layers;

a second metal guard structure between the active circuitry and the first metal guard structure, and separated from the first metal guard structure by a separation distance, the second metal guard structure concentrically surrounding the active circuitry, wherein the second metal guard structure includes a second continuous metal fill between the lowermost metal layer and the uppermost metal layer of the plurality of metal layers;

a first plurality of conductive teeth within the at least one sensor layer and extending horizontally from the first metal guard structure toward the second metal guard structure without contacting the second metal guard structure; and a second plurality of conductive teeth within the at least one sensor layer and extending horizontally from the second metal guard structure toward the first metal guard structure without contacting the first metal guard structure, the second plurality of conductive teeth interdigitating with the first plurality of conductive teeth.

8. The IC structure of claim 7, further comprising one or more electrostatic discharge (ESD) diodes within the substrate below the BEOL stack, the one or more ESD diode being coupled to the first metal guard structure and the second metal guard structure at the lowermost metal layer of the plurality of metal layers.

9. The IC structure of claim 7, wherein the at least one sensor layer comprises a plurality of sensor layers between the lowermost metal layer and the uppermost metal layer of the BEOL stack, each of the plurality of sensor layers having a respective subset of the first plurality of conductive teeth and the second plurality of conductive teeth therein.

10. The IC structure of claim 7, further comprising an electronic sensor having a pair of terminals each coupled to one of the pair of metal guard structures at a selected one of the plurality of metal layers, the electronic sensor being configured to measure a leakage current or a capacitance across the set of interdigitating conductive elements.

11. The IC structure of claim 7, further comprising:

a sensing wire within the BEOL stack between the first and second metal guard structures and within the at least one sensor layer, wherein the sensing wire is discontinuous from the first plurality of conductive teeth and the second plurality of conductive teeth; and an electronic sensor having a pair of terminals coupled to respective ends of the sensing wire, the electronic sensor being configured to measure a resistance or a capacitance across the first and second metal guard structures through the sensing wire.

12. The IC structure of claim 7, further comprising:

a sensing wire within the BEOL stack between the first and second metal guard structures and within a different metal layer of the BEOL stack from the sensor layer;

a plurality of vertically-extending vias within the BEOL stack, each of the plurality of vertically-extending vias electrically connecting the sensing wire to the first metal guard structure through one of the first plurality of conductive teeth or the second metal guard structure through one of the second plurality of conductive teeth; and an electronic sensor having a pair of terminals coupled to respective ends of the sensing wire, the electronic sensor being configured to measure a resistance or a capacitance across the first and second metal guard structures through the sensing wire.

13. The IC structure of claim 7, wherein the first metal guard structure includes a first metal crack stop, and wherein the second metal guard structure includes a second metal crack stop, a moisture oxidation barrier (MOB), or a guard ring.

14. A method for monitoring an integrated circuit (IC) structure, the method comprising:

applying a voltage to a pair of metal guard structures within a back end of line (BEOL) stack having a plurality of metal layers, wherein each metal guard structure includes a continuous metal fill between a lowermost metal layer and a uppermost metal layer of the plurality of metal layers, and wherein the pair of metal guard structures includes a set of interdigitating conductive elements within one of the plurality of metal layers, the set of interdigitating conductive elements including a first plurality of conductive elements electrically coupled to one of the pair of metal guard structures interdigitating with a second plurality of conductive elements electrically coupled to the other of the pair of metal guard structures;

measuring a test current or capacitance through the pair of metal guard structures based on the applied voltage;

calculating a differential current or capacitance between the test current or capacitance and a reference value for the pair of metal guard structures;

in response to the differential current or capacitance not exceeding a threshold, repeating the transmitting and calculating; and in response to the differential current or capacitance exceeding the threshold, transmitting a signal to active circuitry of the IC structure to indicate current leakage through the pair of metal guard structures.

15. The method of claim 14, further comprising ceasing operation of the active circuitry of the IC structure after transmitting the signal to the active circuitry of the IC structure.

16. The method of claim 14, further comprising calculating the threshold based on one of a projected moisture profile of the pair of metal guard structures, or a projected crack propagation through the pair of metal guard structures.

17. The method of claim 14, further comprising, before the applying of the voltage:

manufacturing the IC with the pair of metal guard structures therein;

calculating the reference value or capacitance by applying a calibration voltage through the pair of metal guard structures of the manufactured IC; and recording the reference value or capacitance in a memory portion of the manufactured IC.

18. The method of claim 14, wherein the voltage is configured to mirror an operating current of the active circuitry.

19. The method of claim 14, wherein applying the voltage includes applying the voltage to opposite ends of a sensing wire within the BEOL stack, the sensing wire being electrically coupled to at least one of the set of interdigitating conductive elements or positioned horizontally between at least one pair of the interdigitating conductive elements.

* * * * *